United States Patent [19]
de Leon, Jr. et al.

[11] Patent Number: 4,658,210
[45] Date of Patent: Apr. 14, 1987

[54] NONINTERRUPTIVE NOISE MEASUREMENT

[75] Inventors: Oscar C. de Leon, Jr., Hialeah, Fla.; Philip F. Kromer, III, Winchester, Mass.

[73] Assignee: Racal Data Communications Inc., Miami, Fla.

[21] Appl. No.: 626,315

[22] Filed: Jun. 29, 1984

[51] Int. Cl.⁴ .............................................. G01R 23/16
[52] U.S. Cl. ................................. 324/77 R; 324/57 N; 324/102
[58] Field of Search ................. 324/77 R, 77 A, 57 N, 324/102; 364/574, 514, 517; 455/67; 375/10; 371/5, 64

[56] References Cited

U.S. PATENT DOCUMENTS 4,381,546  4/1983  Armstrong ........................... 364/514
4,555,790  11/1985  Betts et al. ............................ 375/10

FOREIGN PATENT DOCUMENTS 1581165  12/1980  United Kingdom ................. 455/67

OTHER PUBLICATIONS

P. Bryant, F. W. Giesin, Jr., and R. M. Hayes, "Experiments in Line Quality Monitoring," IBM Systems Journal, vol. 15, No. 2, 124–142 (1976).

Simon Huon and Robert Smith, "Network Problem-Determination Aids in Microprocessor-Based Modems," IBM J. Res. Develop., vol. 25, No. 1, 3–16 (Jan. 1981).

Primary Examiner—Michael J. Tokar
Attorney, Agent, or Firm—Jerry A. Miller

[57] ABSTRACT

A noninterruptive noise measurement technique wherein the absolute value of the amplitude error from a modem slicer is compared to a reference, the number of events in excess of said reference over a selected interval are counted and the range within which said count falls is determined as a particular signal to noise ratio value.

4 Claims, 4 Drawing Figures

NONINTERRUPTIVE NOISE MEASUREMENT

BACKGROUND OF THE INVENTION

The subject invention relates to measurement of parameters of communication systems and more particularly to a technique of measuring noise in data communication environments.

The increasing sophistication of diagnostics used in data communication has provided systems which monitor data communication channel performance on a noninterruptive basis. An example of a system which performs such a function is disclosed in U.S. Pat. No. 4,385,384, assigned to the assignee hereof. Development of parameters related to communication channel performance during data transmission is complicated by the fact that distortion from one parameter may interfere with development of a measurement of another. In the case of noise measurement, line distortion may be detected as noise. Also other problems exist in developing a noninterruptive noise measurement.

SUMMARY OF THE INVENTION

It is therefore an object of the invention to provide an improved communication system parameter measurement technique.

It is another object of the invention to provide an improved technique for measurement of noise in a data communication environment.

It is a further object to provide such a noise measurement technique which operates on a noninterruptive basis with digital data transmission and which provides a reliable noise indication despite other disturbances which may be present on the line.

According to the invention, a measure of signal-to-noise (S/N) ratio in the form of a received vector's magnitude is compared to a reference value. A first count of the number of comparisons which exceed the reference level is made, as well as a second count of the number of comparisons. The value of the first count after the second count reaches a selected value is taken as mapping of large amplitude errors to an S/N value. In the preferred embodiment, a plurality of successive signal-to-noise ratio values, as determined by a succession of counting and mapping steps, are averaged.

DETAILED DESCRIPTION OF THE PREFERRED EMBODIMENT

Figure 1:
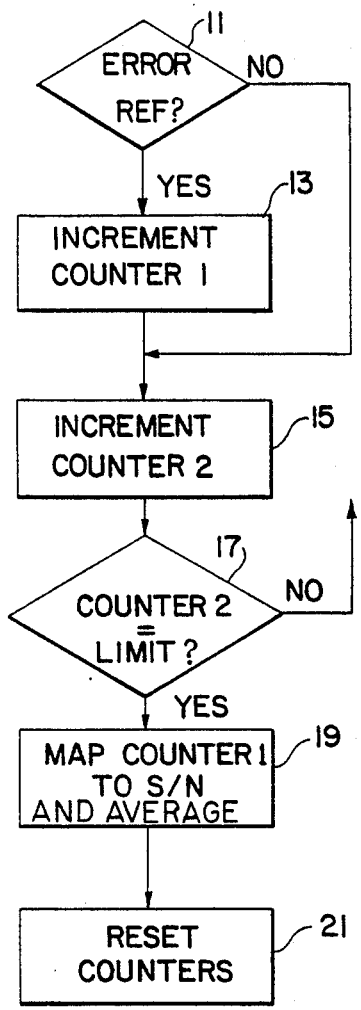
FIG. 1 illustrates a flow chart of the preferred technique.

FIG. 1 illustrates a flow chart of the preferred technique which is suitable for microprocessor or other digital implementation in a data modem receiver. The data measurement is done without interrupting the main channel data. The basic criterion used when measuring the noise is that the measurement is a correlation of the error rate to the S/N ratio. The absolute value of the amplitude error that is derived from the modem's slicer or decision circuit is used as an indicator of S/N.

The absolute value of the amplitude error is compared against a reference value as indicated by test block 11. The reference value is set according to the speed at which the modem is running. This reference value is inversely proportional to the speed.

Once the amplitude error is compared with the reference, then a 16-bit counter is incremented (step 13). This procedure is executed every other symbol interval. A second counter is incremented every time a comparison is made (step 15). Once the second counter reaches a set limit, tested at test 17, the first counter value is used as a mapping of the occurrences of large errors in amplitude to an S/N value.

Mapping is indicated at step 19 after which both counters are reset (step 21). The mapping procedure is a comparison operation which determines which of a number of selected count ranges the actual output of the first counter falls within. Such a mapping procedure proves advantageous since the count of the first counter bears a logarithmic rather than linear relation to the S/N values.

The reference value used in step 11 will determine the range of S/N that can be detected. If the value is set too low, then the line distortion will also be detected as noise. If the value is set too high, the modem will not be able to compensate for the high level of noise. For example, if an S/N of 20 dB is measured by the modem on a back-to-back condition (no line), the noise count reached in step 13 will be of a lower value than that of a count measured using a 506 line between the modem's transmitter and receiver using the same S/N value of 20 dB. Therefore, some tolerance is provided to compensate for the deviations of the count due to line conditioning.

Figure 2:
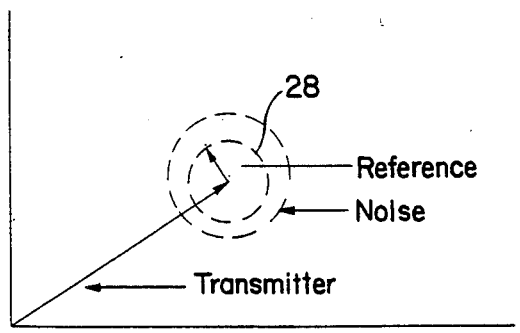
FIG. 2 illustrates the reference setting in the preferred embodiment.

The reference value used in step 11 can be represented as the radius of a circle 28 around the transmitted vector, as shown in FIG. 2. The tolerance about the reference level is set at 20% of the radius 28 (FIG. 2), meaning that once the radius of the vector varies by 20%, the counter is incremented in step 13. If the reference value 28 is set too low, the step 13 counter will overflow at a high S/N ratio at which the modem does not make any errors, rendering the measurement useless to the customer. If the reference level 28 is set too high, the step 13 counter can only count up to a given S/N value and counts made beyond that S/N value are not useful. Nonoptimum selection of the counter range will cause the range of the S/N measurement to be limited to less values of S/N.

The following are the values of the first counter correlated to an S/N value for a 4800-bit-per-second, 1600-symbol-per-second embodiment, using the 20% tolerance discussed above. In such an embodiment a value of 52.1 milliseconds has been used as the limit of the count made in step 17 of FIG. 1.

| | | |
|---|---|---|
| 3 octal ≦ counter value < 55 octal | 21 dB S/N |
| 55 octal ≦ counter value < 122 octal | 20 dB S/N |
| 122 octal ≦ counter value < 212 octal | 19 dB S/N |
| 212 octal ≦ counter value < 373 octal | 18 dB S/N |
| 373 octal ≦ counter value < 676 octal | 17 dB S/N |
| 676 octal ≦ counter value < 1346 octal | 16 dB S/N |
| 1346 octal ≦ counter value < 2124 octal | 15 dB S/N |
| 2124 octal ≦ counter value < 3073 octal | 14 dB S/N |
| 3073 octal ≦ counter value | 13 dB S/N |

Figure 3:
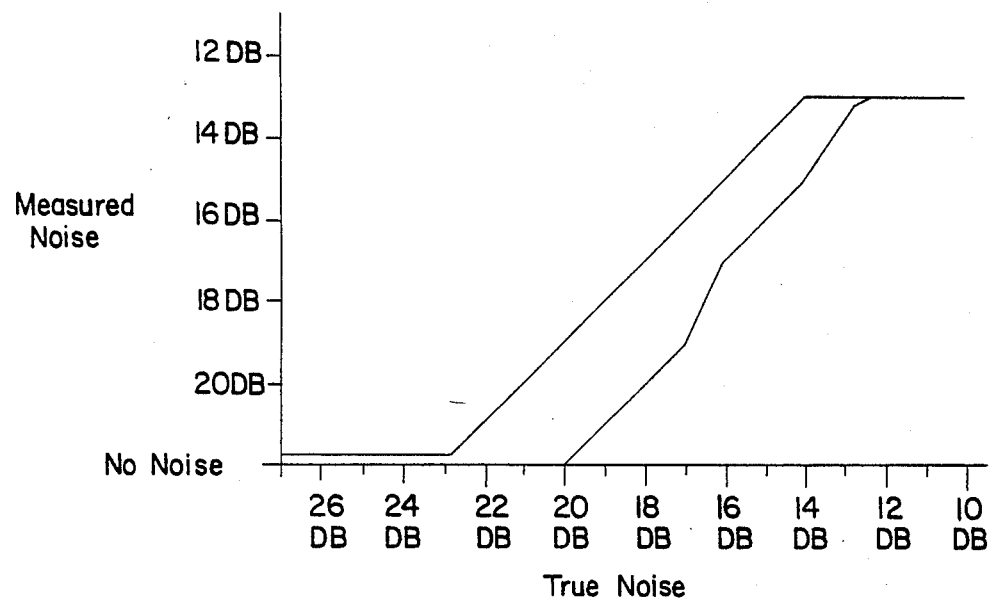
FIG. 3 illustrates a graph of measured noise versus true noise using different transmission lines.
Figure 4:
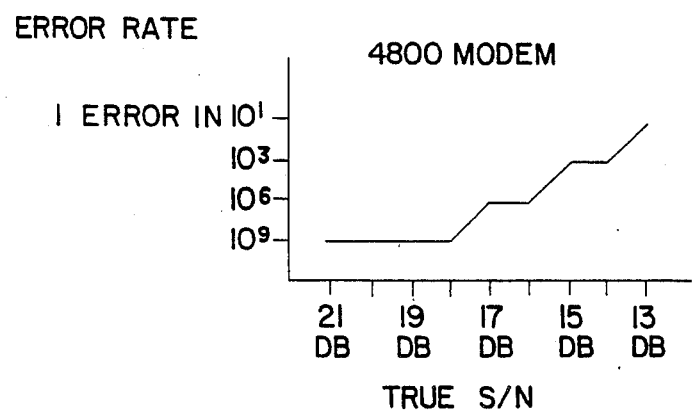
FIG. 4 is a graph of error rate versus S/N.

An example of the results of implementing the subject invention in a 4800 bit per second modem transmitting three bits per symbol interval is shown in FIG. 3. As may be seen, the measurement is restricted from 21 to 13 dB. Also, as the noise level becomes higher, the measurement improves. The 21 to 13 dB region is the only region of interest because it is the region in which the error rate will be changed considerably from an acceptable error rate to an unacceptable error rate, as shown in FIG. 4. The accuracy of the measurement shown in FIG. 3 is ±2 dB for measured S/N between 17 and 22 dB and ±1 dB for measured S/N between 13 and 17 dB.

The foregoing preferred technique is subject to numerous adaptations and modifications without departing from the scope and spirit of the invention. Therefore, it is to be understood that, within the scope of the appended claims, the invention may be practiced other than as specifically described herein.

What is claimed is:

1. A method of and nondisruptive noise measurement comprising the steps of:

setting a reference threshold within a range of received signal vector magnitudes;

counting the number of vectors received over a selected interval which exceed a selected range about said reference to produce an event count; and mapping said event count to a signal-to-noise ratio value.

2. The method of claim 1 wherein said step of mapping is done by decoding a count within a selected range as a selected signal-to-noise ratio.

3. The method of claim 1 or 2 further including the steps of averaging a plurality of signal-to-noise ratio values determined by a succession of said counting and mapping steps.

4. The method of claims 1 or 2 wherein the signal-to-noise ratio values range from 13 dB to 21 dB.

* * * * *